United States Patent

Fukano

[11] Patent Number: 5,986,348
[45] Date of Patent: Nov. 16, 1999

[54] MAGNETIC ALIGNMENT SYSTEM FOR BUMPS ON AN INTEGRATED CIRCUIT DEVICE

[75] Inventor: Atsuyuki Fukano, Tokyo, Japan

[73] Assignee: Ball Semiconductor Inc., Allen, Tex.

[21] Appl. No.: 09/268,770

[22] Filed: Mar. 15, 1999

[51] Int. Cl.[6] .......................... H01L 23/48; H01L 23/52; H01L 29/40
[52] U.S. Cl. ........................................... 257/780; 257/781
[58] Field of Search .................................. 257/780, 781, 257/779, 737

[56] References Cited

U.S. PATENT DOCUMENTS 3,960,279  6/1976  Hartleroad et al. .
4,983,804  1/1991  Chan et al. .
5,164,328  11/1992  Dunn et al. .
5,208,186  5/1993  Mathew .
5,428,249  6/1995  Sawayama et al. .
5,495,378  2/1996  Bonyhard et al. .

OTHER PUBLICATIONS

"Ball–Grid Array: An Ideal Package Option," published in News & Views Q1 1996, Altera Corporation, San Jose, CA.

Primary Examiner—Sheila V. Clark
Attorney, Agent, or Firm—Haynes and Boone, L.L.P.

[57] ABSTRACT

A unique integrated circuit device and method for using same is disclosed. The integrated circuit includes a plurality of bonding pads. Coupled to each bonding pads is a ferromagnetic material and an external connector, such as a solder bump. The ferromagnetic material is isolated to an area associated with each bonding pad. When the ferromagnetic material is magnetized, it is capable of aligning the solder bump to a connection point of another device, as long as the connection point is magnetically attracted. The other device may be a second integrated circuit device or a circuit board. As a result, the bonding pad aligns with and connects to the connection point.

8 Claims, 1 Drawing Sheet

MAGNETIC ALIGNMENT SYSTEM FOR BUMPS ON AN INTEGRATED CIRCUIT DEVICE

BACKGROUND OF THE INVENTION

The invention relates generally to integrated circuits, and more particularly, to a system and method for assembling the integrated circuits for mounting them to devices or other circuit boards.

Conventional integrated circuits, or "chips," are formed from a flat surface semiconductor wafer. The semiconductor wafer is first manufactured in a semiconductor material manufacturing facility and is then provided to a fabrication facility. At the latter fabrication facility, several layers are processed onto the semiconductor wafer surface. Once completed, the wafer is then cut into one or more chips and assembled into packages.

A chip is fabricated with a plurality of bonding pads, usually made of aluminum, for connecting the chip to other devices (e.g., other chips or circuit boards). For very tight, low-profile chips, a solder bump is placed on the aluminum bonding pad and then connected directly to the other device. This technology has several variances, such as flip chip technology, tape-automated bonding, ball-grid array and so forth.

In these technologies, the device to which the chip is connecting may also include a plurality of bonding pads, which may in turn include a plurality of solder bumps. It is important that each of the pads/bumps of the chip are properly aligned with the corresponding pads/bumps of the connecting device. However, as chip size decreases, and as the number of pads/bumps increases, the margin of error for aligning these devices becomes extremely limiting.

This problem is exacerbated when multiple chips must simultaneously align for mounting. Consider for example, co-pending U.S. patent application Ser. No. 08/858,004 filed on May 16, 1997, assigned to the same assignee as the present application and hereby incorporated by reference as if reproduced in its entirety. This application describes a spherical shaped integrated circuit which may be clustered with other spherical shaped integrated circuits to form a single, large-scale device. However, it is very difficult to perform such clustering because of the tight margin of error between the devices.

Therefore, what is needed is a system and method for aligning the bonding pads or solder bumps of devices such as chips or spherical shaped integrated circuits to facilitate their connection with other devices and/or circuit boards.

SUMMARY OF THE INVENTION

In response to the above-described difficulties, a technical advance is achieved by a unique integrated circuit device and method for using same. In one embodiment, the integrated circuit includes a plurality of bonding pads. Coupled to each bonding pads is a ferromagnetic material and an external connector, such as a solder bump. The ferromagnetic material is isolated to an area associated with each bonding pad. When the ferromagnetic material is magnetized, it is capable of aligning the solder bump to a connection point of another device, as long as the connection point is magnetically attracted. The other device may be a second integrated circuit device or a circuit board. As a result, the bonding pad aligns with and connects to the connection point.

DESCRIPTION OF THE EMBODIMENTS

Figure 1:
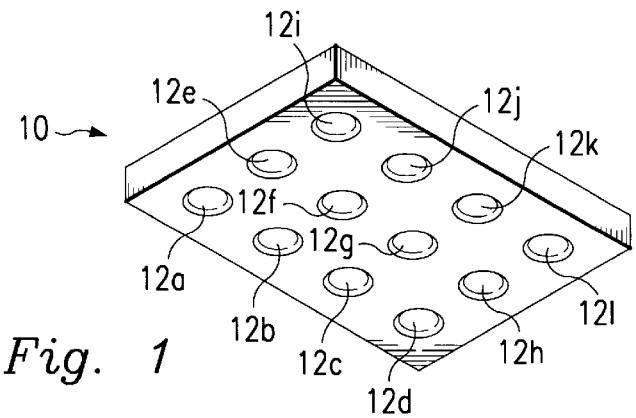
FIG. 1 is an illustration of an exemplary chip having a plurality of bonding pads for implementing features of the present invention.

Referring to FIG. 1, the reference numeral 10 refers, in general, to one embodiment of a chip for implementing features of the present invention. The chip 10 is shown, for the sake of example, to include twelve bonding pads 12a–12l. Also for the sake of example, the chip 10 is designed and assembled for tape automated bonding (TAB). In the present example, the bonding pads 12a–12l are made of aluminum, but it is understood that other conductive materials, such as copper, may also be used.

Figure 2:
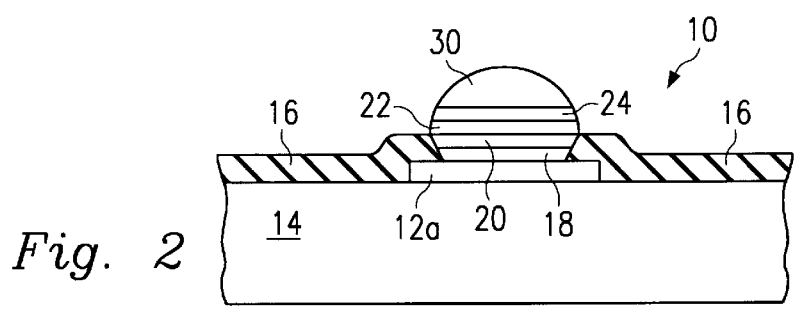
FIG. 2 provides an expanded view of the chip of FIG. 1, including one bonding pad and a solder bump connected thereto.

Referring now to FIG. 2, a portion of the chip 10 is shown, with bonding pad 12a isolated for the sake of example. The pad 12a is layered on top of a substrate 14 and is surrounded by an insulating layer 16. Layered on top of the bonding pad 12a is a first metal layer 18, and a second metal layer 20. The second metal layer 20 acts as a 'stopper,' to prevent diffusion of heavy metals (described later) into the chip. On top of the second metal layer 20 is a ferromagnetic material 22. The ferromagnetic material 22 can be applied by such conventional techniques as plating or sputtering. Also, the thickness of the ferromagnetic material 22 is chosen for a desired magnetic strength, discussed in greater detail, below. On top of the ferromagnetic material 22 is a wettable layer 24, such as one made of gold.

The layers 18–24 extend the bonding pad 12a for use in solder-bump bonding. The layers may be added during fabrication of the device 10, or may alternatively be added at the assembly processes. Once the layers 18–24 have been formed, a solder bump 30 is formed on top of the gold layer 24. The gold layer 24 has good wettability which allows the solder bump 30 to adhere and to form a ball. The solder bump 30 is applied using conventional processes and therefore will not be discussed in greater detail. The layers 18–24 and solder bump 30 are similarly applied to each of the pads 12b–12l.

Figure 3:
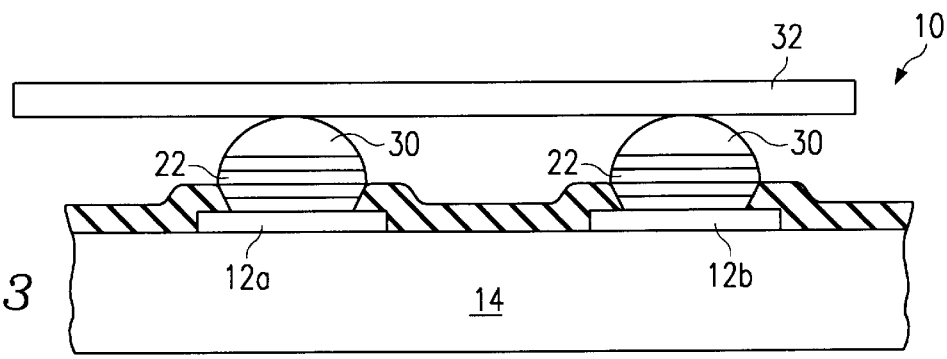
FIG. 3 is an illustration of how the bonding pad and solder bump of FIG. 2 is magnetized.

Referring to FIG. 3, once the solder bumps 30 have been formed onto the pads 12a–12l, the ferromagnetic material 22 can be magnetized with a magnet 32. For example, the magnet 32 can be placed over the solder bumps 30 for a predetermined period of time until the material 22 is fully magnetized. The content and thickness of the ferromagnetic material 22 can be adjusted to obtain the desired amount of magnetism.

Figure 4:
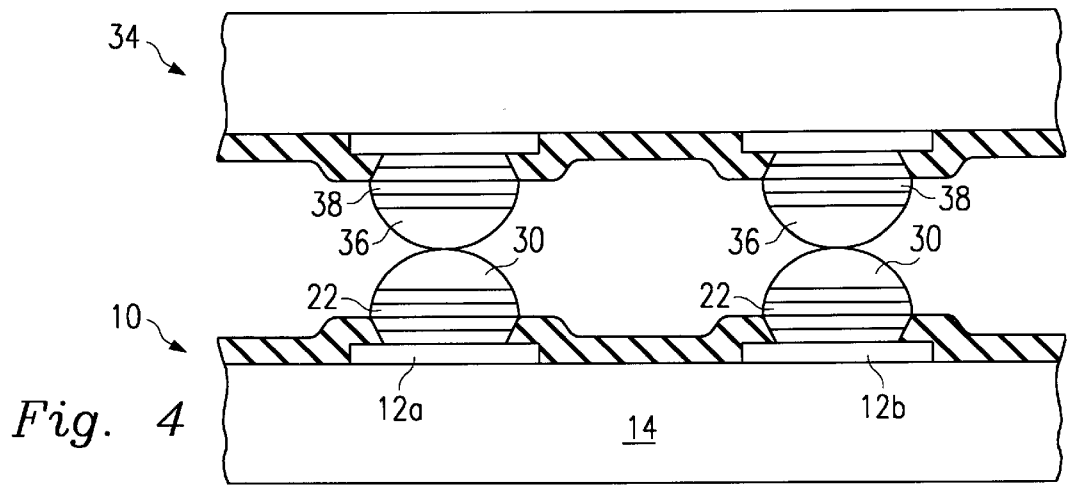
FIG. 4 is an illustration of how the bonding pads and solder bumps of FIG. 3 are aligned to another device such as another chip.

Referring to FIG. 4, once the ferromagnetic material 22 is magnetized, the chip 20 can be aligned with another device. For the sake of example, the chip 10 can be aligned with a similar chip 34. The chip 34 includes solder bumps 36 that will align with the solder bumps 30. The chip 34 also includes ferromagnetic material 38 associated with each solder bump 36. In this way, the ferromagnetic material 38 is attracted to and aligns with the magnetized ferromagnetic material 22, thus aligning the chip 34 with the chip 10.

It should be clearly understood that various modifications, changes and substitutions are intended in the foregoing disclosure and in some instances some features of the invention will be employed without a corresponding use of other features. For example, the present invention may be applied to a spherical-shaped integrated circuit device, such as is described in presently incorporated U.S. patent application Ser. No. 08/858,004 filed on May 16, 1997. Also, the number and content of the layers 12a–12l are provided merely for the sake of example. In other embodiments, the ferromagnetic material may be in a single layer, or even part of the solder bump. Accordingly, it is appropriate that the appended claims be construed broadly and in a manner consistent with the scope of the invention.

What is claimed is:

1. An integrated circuit device comprising:

a bonding pad;

a ferromagnetic material coupled to the bonding pad;

an external connector coupled to the ferromagnetic material;

wherein the ferromagnetic material, when magnetized, is capable of aligning the external connector to a connection point, thereby connecting the bonding pad to the connection point.

2. The device of claim 1 wherein the external connector is a solder bump.

3. The device of claim 1 wherein the ferromagnetic material is isolated to an area associated with the bonding pad.

4. The device of claim 1 wherein the connection point includes a second ferromagnetic material which is attracted to the first magnetized ferromagnetic material.

5. The device of claim 4 wherein the connection point is part of a second integrated circuit device.

6. The device of claim 4 wherein the connection point is part of a circuit board.

7. An integrated circuit comprising a plurality of bonding pads and sequentially coupled to each bonding pad:

a ferromagnetic layer;

a stopper layer positioned between the bonding pad and the ferromagnetic layer;

a wettable layer readily connectable to the ferromagnetic layer and a solder bump; and the solder bump;

wherein the integrated circuit can be aligned with another device by magnetizing the ferromagnetic layer and mating the solder bumps with a plurality of corresponding solder bumps on another device.

8. The integrated circuit of claim 7 wherein the stopper layer is a heavy metal and the wettable layer is gold.

* * * * *